United States Patent  
Langley et al.

(10) Patent No.: US 10,341,581 B2  
(45) Date of Patent: Jul. 2, 2019

(54) RADIOGRAPHIC DETECTOR WITH HEAT SINK

(71) Applicant: Carestream Health, Inc., Rochester, NY (US)

(72) Inventors: Robert J. Langley, Pittsford, NY (US); Steven D. Daniels, Churchville, NY (US)

(73) Assignee: Carestream Health, Inc., Rochester, NY (US)

( * ) Notice: Subject to any disclaimer, the term of this patent is extended or adjusted under 35 U.S.C. 154(b) by 0 days.

(21) Appl. No.: 15/896,326

(22) Filed: Feb. 14, 2018

(65) Prior Publication Data

US 2018/0234642 A1 Aug. 16, 2018

Related U.S. Application Data

(60) Provisional application No. 62/458,608, filed on Feb. 14, 2017.

(51) Int. Cl.
*H04N 5/32* (2006.01)
*H05K 7/20* (2006.01)
*H05K 13/04* (2006.01)
*H01L 23/552* (2006.01)
*H01L 27/146* (2006.01)

(52) U.S. Cl.
CPC .............. *H04N 5/32* (2013.01); *H01L 23/552* (2013.01); *H01L 27/1463* (2013.01); *H01L 27/1469* (2013.01); *H01L 27/14618* (2013.01); *H05K 7/20445* (2013.01); *H05K 13/04* (2013.01)

(58) Field of Classification Search
CPC ....... G01T 1/2018; G01T 1/20; G01T 1/2928; G01T 1/247; H04N 5/32; H01L 23/552; H01L 27/14618; H01L 27/1463; H01L 27/1469; H05K 7/20445; H05K 13/04
USPC ................. 250/370.09, 370.11, 370.08, 394
See application file for complete search history.

(56) References Cited

U.S. PATENT DOCUMENTS

| | | | | |
|---|---|---|---|---|
| 5,440,130 | A * | 8/1995 | Cox | G01T 1/2018 250/370.09 |
| 2003/0010923 | A1 * | 1/2003 | Zur | G01T 1/2018 250/370.09 |
| 2005/0201788 | A1 * | 9/2005 | Kubochi | G03G 15/2039 399/381 |
| 2008/0112535 | A1 * | 5/2008 | Wojcik | A61B 6/4233 378/62 |
| 2009/0015981 | A1 * | 1/2009 | Utschig | H01J 47/002 361/220 |
| 2009/0085823 | A1 * | 4/2009 | Mason | H01L 23/66 343/853 |
| 2009/0290680 | A1 * | 11/2009 | Tumer | G01T 1/247 378/62 |
| 2010/0008046 | A1 * | 1/2010 | Mahoney | H01L 23/3677 361/709 |
| 2013/0221230 | A1 * | 8/2013 | Tredwell | G01T 1/20 250/366 |

* cited by examiner

*Primary Examiner* — David P Porta
*Assistant Examiner* — Blake C Riddick

(57) ABSTRACT

A digital radiographic detector includes a multi-layered core having integrated circuits generating heat within a housing of the detector. A thermally conductive component that is configured to provide a distinct function for the core is thermally coupled to the integrated circuits to also serve as a heat sink therefor.

12 Claims, 8 Drawing Sheets

RADIOGRAPHIC DETECTOR WITH HEAT SINK

CROSS REFERENCE TO RELATED APPLICATIONS

This application claims priority to U.S. Patent Application Ser. No. 62/458,608, filed Feb. 14, 2017, in the name of Langley et al., and entitled RADIOGRAPHIC DETECTOR WITH HEAT SINK, which is hereby incorporated by reference herein in its entirety.

BACKGROUND OF THE INVENTION

The subject matter disclosed herein relates to digital radiographic (DR) detectors.

Portable digital radiographic detectors have been widely deployed to improve diagnostic radiographic imaging productivity, image quality and ease of use. In particular, mobile or bedside radiographic imaging is conducted in locations such as intensive care units so that the patient does not need to be transported from their critical care environment. This type of imaging procedure is best served by a portable detector to improve ease of use and reliability.

Current digital radiographic detectors typically include an image sensor array made from amorphous silicon having thin-film-transistors and photo diodes fabricated on a substrate, such as a rigid glass substrate, using semiconductor processes that are similar to those used for flat panel displays. A scintillator is combined with the image sensor array, along with required electronics for image signal readout and image processing, onto an internal multilayer core plate which is contained within a durable housing, such as a carbon fiber housing, to create the portable DR detector.

Heat generated inside a DR detector having a thermally nonconductive carbon fiber housing may not have a good thermal dissipation path. Heat accumulating in pockets within the carbon fiber housing may cause imaging problems in DR detectors.

Advantageous features of the digital radiographic detectors disclosed herein include light weight, durable DR detector, with a housing such as a carbon fiber based housing, having excellent thermal management and a layered core plate assembly that takes advantage of the benefits provided by a light weight image sensor core and well designed thermal management.

FIG. 1 is a perspective view of a digital radiographic (DR) imaging system 10 that may include a generally curved or planar DR detector 40 (shown in a planar embodiment and without a housing for clarity of description), an x-ray source 14 configured to generate radiographic energy (x-ray radiation), and a digital monitor, or electronic display, 26 configured to display images captured by the DR detector 40, according to one embodiment. The DR detector 40 may include a two dimensional array 12 of detector cells 22 (photosensors), arranged in electronically addressable rows and columns. The DR detector 40 may be positioned to receive x-rays 16 passing through a subject 20 during a radiographic energy exposure, or radiographic energy pulse, emitted by the x-ray source 14. As shown in FIG. 1, the radiographic imaging system 10 may use an x-ray source 14 that emits collimated x-rays 16, e.g. an x-ray beam, selectively aimed at and passing through a preselected region 18 of the subject 20. The x-ray beam 16 may be attenuated by varying degrees along its plurality of rays according to the internal structure of the subject 20, which attenuated rays are detected by the array 12 of photosensitive detector cells 22.

The curved or planar DR detector 40 is positioned, as much as possible, in a perpendicular relation to a substantially central ray 17 of the plurality of rays 16 emitted by the x-ray source 14. In a curved array embodiment, the source 14 may be centrally positioned such that a larger percentage, or all, of the photosensitive detector cells are positioned perpendicular to incoming x-rays from the centrally positioned source 14. The array 12 of individual photosensitive cells (pixels) 22 may be electronically addressed (scanned) by their position according to column and row. As used herein, the terms "column" and "row" refer to the vertical and horizontal arrangement of the photo sensor cells 22 and, for clarity of description, it will be assumed that the rows extend horizontally and the columns extend vertically. However, the orientation of the columns and rows is arbitrary and does not limit the scope of any embodiments disclosed herein. Furthermore, the term "subject" may be illustrated as a human patient in the description of FIG. 1, however, a subject of a DR imaging system, as the term is used herein, may be a human, an animal, an inanimate object, or a portion thereof.

In one exemplary embodiment, the rows of photosensitive cells 22 may be scanned one or more at a time by electronic scanning circuit 28 so that the exposure data from the array 12 may be transmitted to electronic read-out circuit 30. Each photosensitive cell 22 may independently store a charge proportional to an intensity, or energy level, of the attenuated radiographic radiation, or x-rays, received and absorbed in the cell. Thus, each photosensitive cell, when read-out, provides information defining a pixel of a radiographic image 24, e.g. a brightness level or an amount of energy absorbed by the pixel, that may be digitally decoded by image processing electronics 34 and transmitted to be displayed by the digital monitor 26 for viewing by a user. An electronic bias circuit 32 is electrically connected to the two-dimensional detector array 12 to provide a bias voltage to each of the photosensitive cells 22.

Each of the bias circuit 32, the scanning circuit 28, and the read-out circuit 30 may include heat generating integrated circuits and may communicate with an acquisition control and image processing unit 34 over a connected cable 33 (wired), or the DR detector 40 and the acquisition control and image processing unit 34 may be equipped with a wireless transmitter and receiver to transmit radiographic image data wirelessly 35 to the acquisition control and image processing unit 34. The acquisition control and image processing unit 34 may include a processor and electronic memory (not shown) to control operations of the DR detector 40 as described herein, including control of circuits 28, 30, and 32, for example, by use of programmed instructions, and to store and process image data. The acquisition control and image processing unit 34 may also be used to control activation of the x-ray source 14 during a radiographic exposure, controlling an x-ray tube electric current magnitude, and thus the fluence of x-rays in x-ray beam 16, and/or the x-ray tube voltage, and thus the energy level of the x-rays in x-ray beam 16. A portion or all of the acquisition control and image processing unit 34 functions may reside in the detector 40 in an on-board processing system 36 which may include a processor and electronic memory to control operations of the DR detector 40 as described herein, including control of circuits 28, 30, and 32, by use of programmed instructions, and to store and process image data similar to the functions of standalone acquisition control and image processing system 34. The image processing system may perform image acquisition and image disposition functions as described herein. The image processing system 36 may control image transmission and image processing and image correction on board the detector 40 based on instructions or other commands transmitted from the acquisition control and image processing unit 34, and transmit corrected digital image data therefrom. Alternatively, acquisition control and image processing unit 34 may receive raw image data from the detector 40 and process the image data and store it, or it may store raw unprocessed image data in local memory, or in remotely accessible memory.

With regard to a direct detection embodiment of DR detector 40, the photosensitive cells 22 may each include a sensing element sensitive to x-rays, i.e. it absorbs x-rays and generates an amount of charge carriers in proportion to a magnitude of the absorbed x-ray energy. A switching element may be configured to be selectively activated to read out the charge level of a corresponding x-ray sensing element. With regard to an indirect detection embodiment of DR detector 40, photosensitive cells 22 may each include a sensing element sensitive to light rays in the visible spectrum, i.e. it absorbs light rays and generates an amount of charge carriers in proportion to a magnitude of the absorbed light energy, and a switching element that is selectively activated to read the charge level of the corresponding sensing element. A scintillator, or wavelength converter, may be disposed over the light sensitive sensing elements to convert incident x-ray radiographic energy to visible light energy. Thus, in the embodiments disclosed herein, it should be noted that the DR detector 40 (or DR detector 300 in FIG. 3 or DR detector 400 in FIG. 4) may include an indirect or direct type of DR detector.

Examples of sensing elements used in sensing array 12 include various types of photoelectric conversion devices (e.g., photosensors) such as photodiodes (P-N or PIN diodes), photo-capacitors (MIS), photo-transistors or photoconductors. Examples of switching elements used for signal read-out include a-Si TFTs, oxide TFTs, MOS transistors, bipolar transistors and other p-n junction components.

FIG. 2 is a schematic diagram 240 of a portion of a two-dimensional array 12 for a DR detector 40. The array of photosensor cells 212, whose operation may be consistent with the photosensor array 12 described above, may include a number of hydrogenated amorphous silicon (a-Si:H) n-i-p photodiodes 270 and thin film transistors (TFTs) 271 formed as field effect transistors (FETs) each having gate (G), source (S), and drain (D) terminals. In embodiments of DR detector 40 disclosed herein, such as a multilayer DR detector (400 of FIG. 4), the two-dimensional array of photosensor cells 12 may be formed in a device layer that abuts adjacent layers of the DR detector structure, which adjacent layers may include a rigid glass layer or a flexible polyimide layer or a layer including carbon fiber without any adjacent rigid layers. A plurality of gate driver circuits 228 may be electrically connected to a plurality of gate lines 283 which control a voltage applied to the gates of TFTs 271, a plurality of readout circuits 230 may be electrically connected to data lines 284, and a plurality of bias lines 285 may be electrically connected to a bias line bus or a variable bias reference voltage line 232 which controls a voltage applied to the photodiodes 270. Charge amplifiers 286 may be electrically connected to the data lines 284 to receive signals therefrom. Outputs from the charge amplifiers 286 may be electrically connected to a multiplexer 287, such as an analog multiplexer, then to an analog-to-digital converter (ADC) 288, or they may be directly connected to the ADC, to stream out the digital radiographic image data at desired rates. In one embodiment, the schematic diagram of FIG. 2 may represent a portion of a DR detector 40 such as an a-Si:H based indirect flat panel, curved panel, or flexible panel imager.

Incident x-rays, or x-ray photons, 16 are converted to optical photons, or light rays, by a scintillator, which light rays are subsequently converted to electron-hole pairs, or charges, upon impacting the a-Si:H n-i-p photodiodes 270. In one embodiment, an exemplary detector cell 222, which may be equivalently referred to herein as a pixel, may include a photodiode 270 having its anode electrically connected to a bias line 285 and its cathode electrically connected to the drain (D) of TFT 271. The bias reference voltage line 232 can control a bias voltage of the photodiodes 270 at each of the detector cells 222. The charge capacity of each of the photodiodes 270 is a function of its bias voltage and its capacitance. In general, a reverse bias voltage, e.g. a negative voltage, may be applied to the bias lines 285 to create an electric field (and hence a depletion region) across the pn junction of each of the photodiodes 270 to enhance its collection efficiency for the charges generated by incident light rays. The image signal represented by the array of photosensor cells 212 may be integrated by the photodiodes while their associated TFTs 271 are held in a non-conducting (off) state, for example, by maintaining the gate lines 283 at a negative voltage via the gate driver circuits 228. The photosensor cell array 212 may be read out by sequentially switching rows of the TFTs 271 to a conducting (on) state by means of the gate driver circuits 228. When a row of the pixels 22 is switched to a conducting state, for example by applying a positive voltage to the corresponding gate line 283, collected charge from the photodiode in those pixels may be transferred along data lines 284 and integrated by the external charge amplifier circuits 286. The row may then be switched back to a non-conducting state, and the process is repeated for each row until the entire array of photosensor cells 212 has been read out. The integrated signal outputs are transferred from the external charge amplifiers 286 to an analog-to-digital converter (ADC) 288 using a parallel-to-serial converter, such as multiplexer 287, which together comprise read-out circuit 230.

This digital image information may be subsequently processed by image processing system 34 to yield a digital image which may then be digitally stored and immediately displayed on monitor 26, or it may be displayed at a later time by accessing the digital electronic memory containing the stored image. The flat panel DR detector 40 having an imaging array as described with reference to FIG. 2 is capable of both single-shot (e.g., static, radiographic) and continuous (e.g., fluoroscopic) image acquisition.

FIG. 3 shows a perspective view of an exemplary prior art generally rectangular, planar, portable wireless DR detector 300 according to an embodiment of DR detector 40 disclosed herein. The DR detector 300 may include a flexible substrate to allow the DR detector to capture radiographic images in a curved orientation. The flexible substrate may be fabricated in a permanent curved orientation, or it may remain flexible throughout its life to provide an adjustable curvature in two or three dimensions, as desired. The DR detector 300 may include a similarly flexible housing portion 314 that surrounds a multilayer structure, or core, comprising a flexible photosensor array portion 22 of the DR detector 300. The housing portion 314 of the DR detector 300 may include a continuous, rigid or flexible, x-ray opaque material or, as used synonymously herein a radio-opaque material, surrounding an interior volume of the DR detector 300. The housing portion 314 may include four flexible edges 318, extending between the top side 321 and the bottom side 322, and arranged substantially orthogonally in relation to the top and bottom sides 321, 322. The bottom side 322 may be continuous with the four edges and disposed opposite the top side 321 of the DR detector 300. The top side 321 comprises a top cover 312 attached to the housing portion 314 which, together with the housing portion 314, substantially encloses the core in the interior volume of the DR detector 300. The top cover 312 may be attached to the housing 314 to form a seal therebetween, and be made of a material that passes x-rays 16 without significant attenuation thereof, i.e., an x-ray transmissive material or, as used synonymously herein, a radiolucent material, such as a carbon fiber, carbon fiber embedded plastic, polymeric, elastomeric and other plastic based material.

With reference to FIG. 4, there is illustrated in schematic form an exemplary cross-section view along section 4-4 of the exemplary embodiment of the DR detector 300 (FIG. 3). For spatial reference purposes, one major surface, or side, of the DR detector 400 may be referred to as the top side 451 and a second major surface, or side, of the DR detector 400 may be referred to as the bottom side 452, as used herein. The core layers, sheets, or plates may be disposed within the interior volume 450 enclosed by the housing 314 and top cover 312 and may include a flexible curved or planar scintillator layer 404 over a curved or planar the two-dimensional imaging sensor array 12 shown schematically as the device layer 402. The scintillator layer 404 may be directly under (e.g., directly connected to) the substantially planar top cover 312, and the imaging array 402 may be directly under the scintillator 404. Alternatively, a flexible layer 406 may be positioned between the scintillator layer 404 and the top cover 312 as part of the core layered structure to allow adjustable curvature of the core layered structure and/or to provide shock absorption. The flexible layer 406 may be selected to provide an amount of flexible support for both the top cover 312 and the scintillator 404, and may comprise a foam rubber type of material. The layers just described comprising the core layered structure each may generally be formed in a rectangular shape and defined by edges arranged orthogonally and disposed in parallel with an interior side of the edges 318 of the housing 314, as described in reference to FIG. 3.

A substrate layer 420 may be disposed under the imaging array 402, such as a rigid glass layer, in one embodiment, or flexible substrate comprising polyimide or carbon fiber upon which the array of photosensors 402 may be formed to allow adjustable curvature of the array, and may comprise another layer of the core layered structure. Under the substrate layer 420 a radio-opaque shield layer 418, such as lead, may be used as an x-ray blocking layer to help prevent scattering of x-rays passing through the substrate layer 420 as well as to block x-rays reflected from other surfaces in the interior volume 450. Readout electronics, including the scanning circuit 28, the read-out circuit 30, the bias circuit 32, and processing system 36 (all shown in FIG. 1) may be formed adjacent the imaging array 402 or, as shown, may be disposed below support member 416 in the form of integrated circuits (ICs) electrically connected to printed circuit boards (PCBs) 424, 425.

The support member 416 may be electrically conductive, such as an aluminum support, or other electrically conductive material. The support member 416, if made from a metal, may also be thermally conductive. As an electrically conductive structure, the support member 416 may be configured to function as a ground plane, or ground circuit, for the PCBs 424, 425. Thus, the support member 416 may be electrically connected to the PCBs 424, 425 using electrically conductive connectors 421. The imaging array 402 may be electrically connected to the readout electronics 424 (ICs) over a flexible connector 428 which may comprise a plurality of flexible, sealed conductive circuits known as chip-on-film (CoF) flex circuits. As a thermally conductive structure, the support member 416 may be configured to also function as a heat sink to dissipate heat generated by the IC chips on the PCBs 424, 425 or IC chips on the CoF flex circuit, as described herein below.

X-ray flux may pass through the radiolucent top panel cover 312, in the direction represented by an exemplary x-ray beam 16, and impinge upon scintillator 404 where stimulation by the high-energy x-rays 16, or photons, causes the scintillator 404 to emit lower energy photons as visible light rays which are then received in the photosensors of imaging array 402. The frame support member 416 may connect the core layered structure to the housing 314 and may further operate as a shock absorber by disposing elastic pads (not shown) between the frame support beams 422 and the housing 314. Fasteners 410 may be used to attach the top cover 312 to the housing 314 and create a seal therebetween in the region 430 where they come into contact. In one embodiment, an external bumper 412 may be attached along the edges 318 of the DR detector 400 to provide additional shock-absorption.

Processes have been developed that enable fabrication of the image sensor array and core layers onto durable thin substrates that are enclosed in a carbon fiber housing having a unitary structure. This highly durable substrate enables the use of alternative housing components that are lighter in weight.

In one embodiment illustrated in FIG. 5, a carbon fiber unitary housing 514 in the form of a four or five sided box is used to create a structurally sound, fluid resistant outer enclosure. The housing 514 has an open end to enable insertion of a multilayer core subassembly 502 into the open end of the housing 514, as shown. The multilayer core subassembly 502 may include a metal ground plate, or plane, onto which the sensor panel with attached scintillator, sensor readout electronics, and image data processing circuit boards are mated. After insertion of the multilayer core subassembly 502 into the housing 514, an end cap, or cover, may be mounted onto the open end of the housing 514 to complete the enclosure.

The discussion above is merely provided for general background information and is not intended to be used as an aid in determining the scope of the claimed subject matter.

BRIEF DESCRIPTION OF THE INVENTION

An electrically conductive layer used as a ground plane, support layer, and/or electromagnetic interference (EMI) shield already present in a DR detector's layered core subassembly may also be used as a heat sink. Modifying this layer to physically and/or thermally contact heat generating components of the DR detector subassembly takes advantage of the thermal conductivity of the ground and/or EMI shield to dissipate the generated heat. Heat dissipation is improved in such DR detectors that have components with a volume of thermally conductive material therein, such as a ground plate. The ground plate, or plane, provides a greater amount of thermally conductive paths that may be used to dissipate heat, or to channel heat to the outside environment of the detector.

A digital radiographic detector includes a multi-layered core having integrated circuits generating heat within a housing of the detector. A thermally conductive component that is configured to provide a distinct function for the core is thermally coupled to the integrated circuits to also serve as a heat sink therefor.

In one embodiment, a digital radiographic detector includes a multi-layered core having a two-dimensional array of photo-sensitive cells. Control circuitry is in electrical communication with the photosensitive cells, and a grounding plane provides an electrical ground for the circuitry. A housing encloses the multi-layered core and a thermally conductive member is thermally coupled to the circuitry and the grounding plane.

In another embodiment, a digital radiographic detector includes a multi-layered core having a two-dimensional array of photo-sensitive cells, integrated circuits in electrical communication with the photosensitive cells, and a thermally conductive component configured to provide a separate and distinct function for the multi-layered core. A thermally conductive link is configured to thermally couple the integrated circuits to the thermally conductive component.

In another embodiment, a method includes providing a digital radiographic detector having a multi layered core with a two-dimensional array of photo-sensitive cells. An integrated circuit in the detector is electrically connected to the array of photo-sensitive cells, and another component of the detector is configured to provide a separate and distinct function for the multi-layered core. A thermally conductive path is formed between the integrated circuits and the component configured to provide the distinct function for the multi-layered core.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

Figure 1:
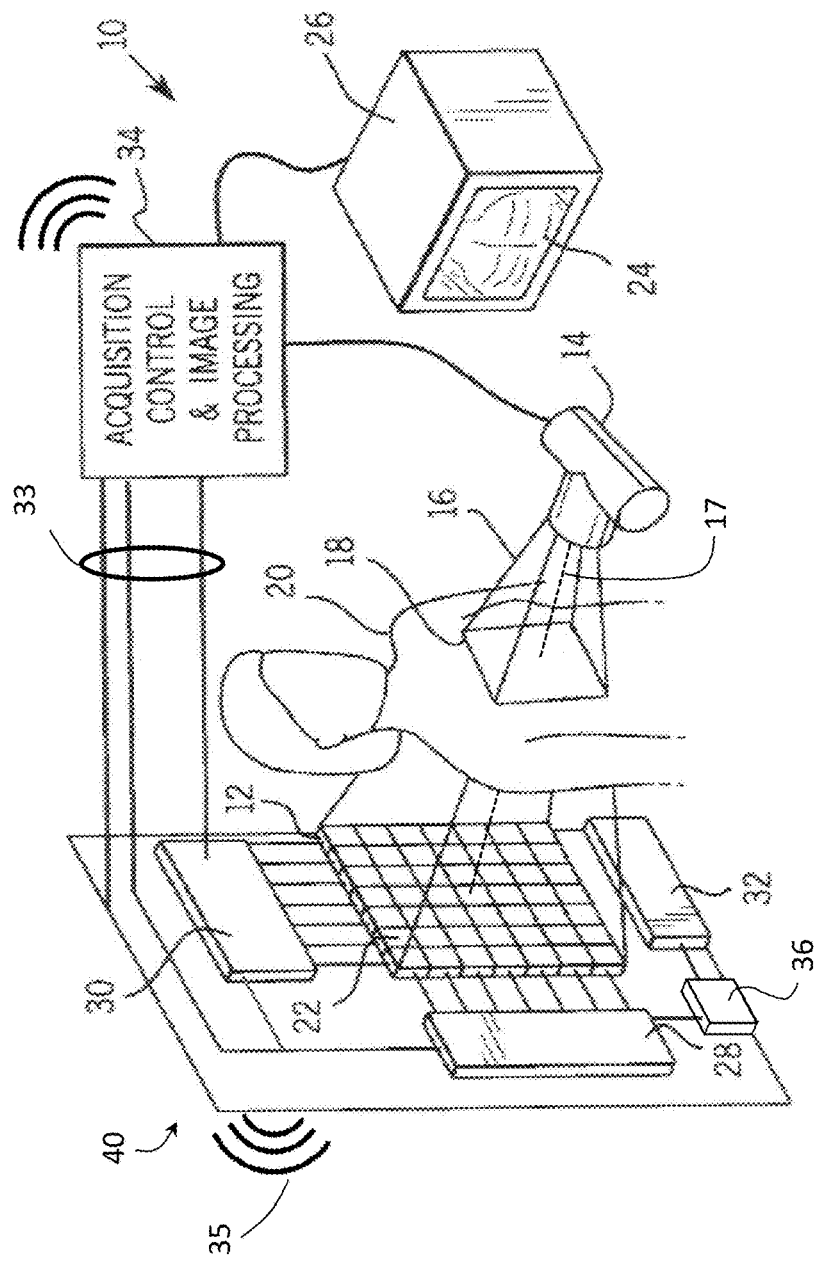
FIG. 1 is a schematic perspective view of an exemplary x-ray system.
Figure 2:
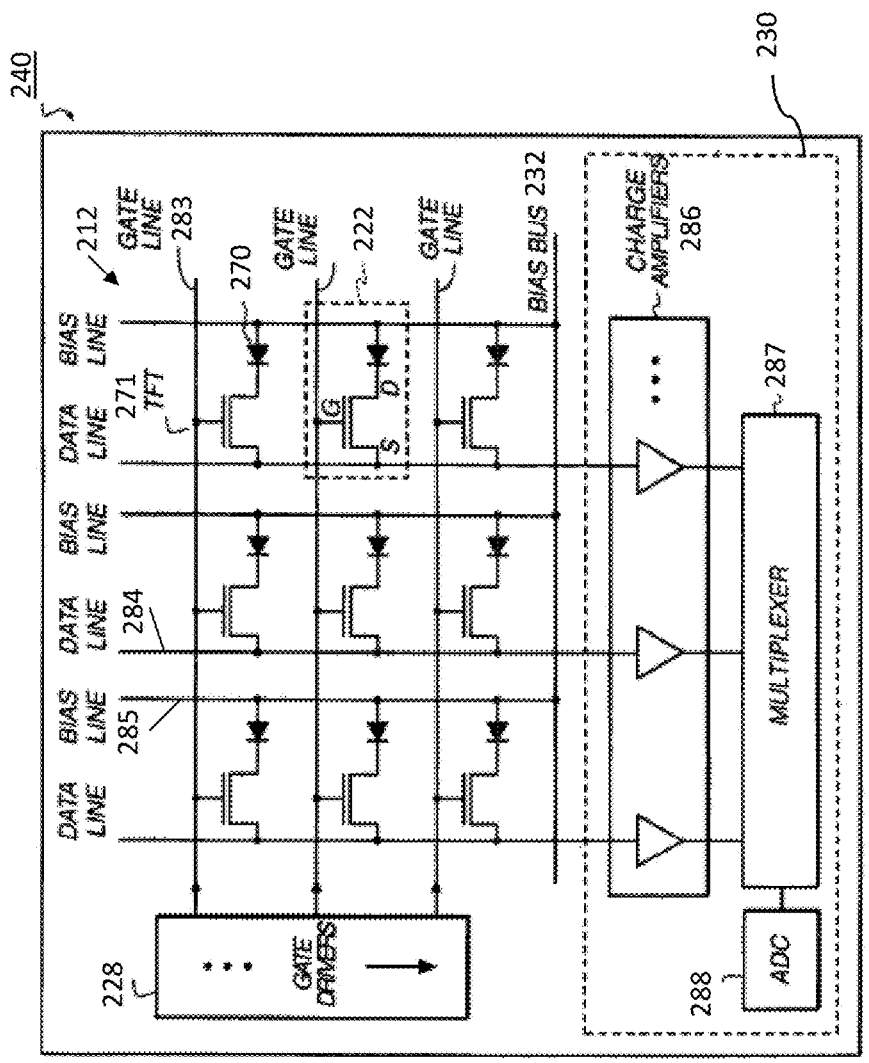
FIG. 2 is a schematic diagram of a photosensor array in a radiographic detector.
Figure 3:
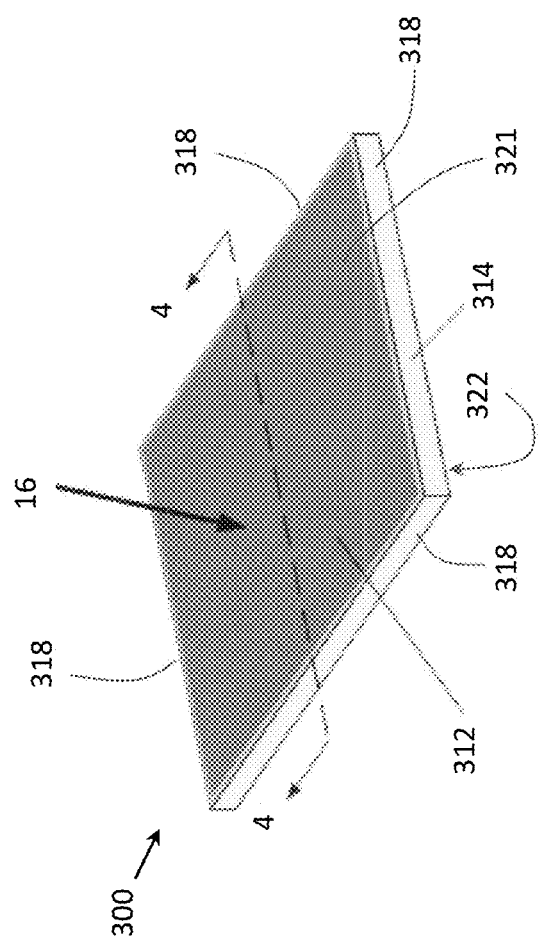
FIG. 3 is a perspective diagram of an exemplary DR detector.
Figure 4:
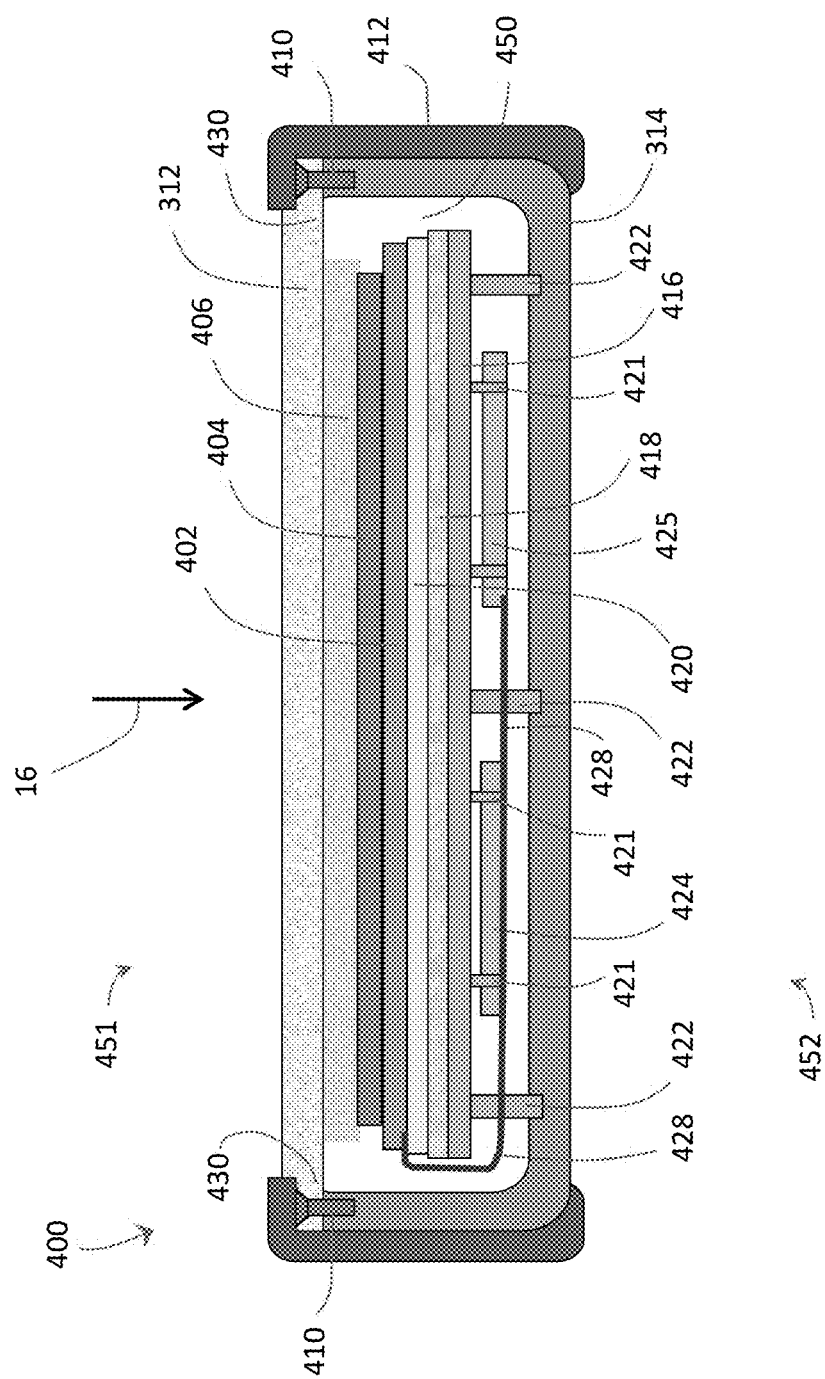
FIG. 4 is a cross section diagram of an exemplary DR detector.
Figure 5:
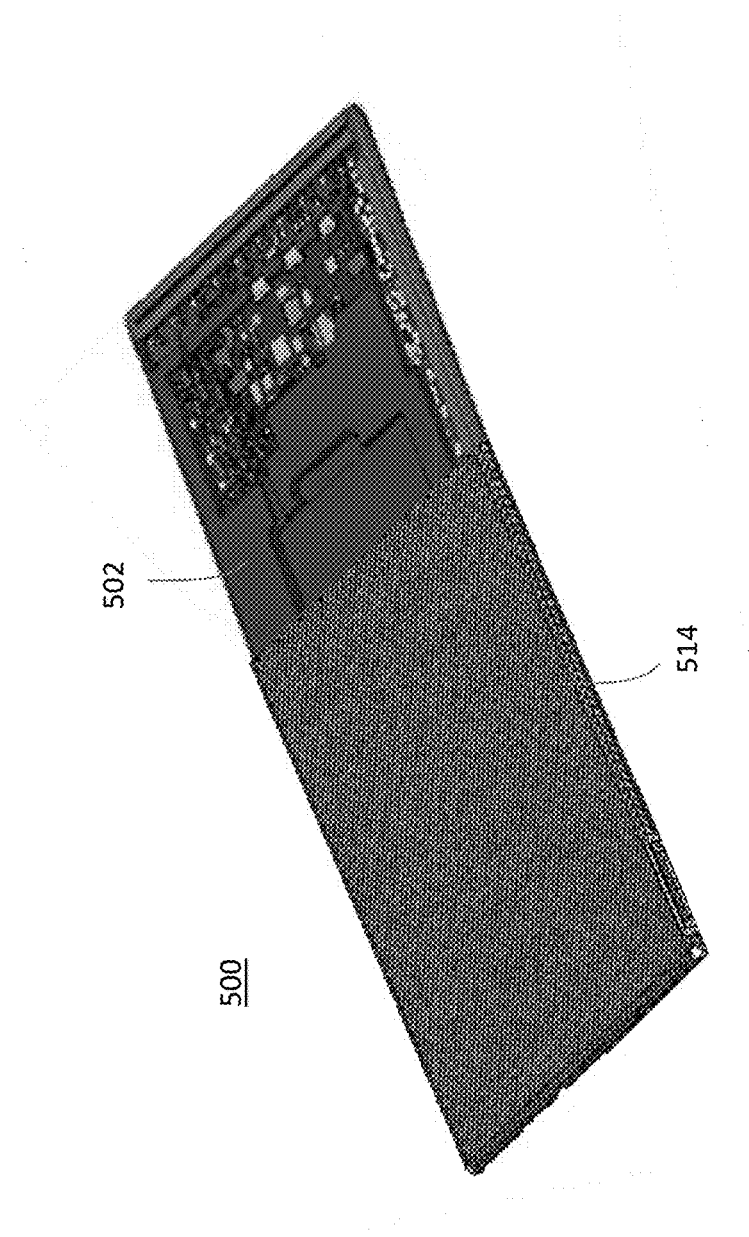
FIG. 5 is a perspective diagram of another exemplary DR detector.
Figure 6A:
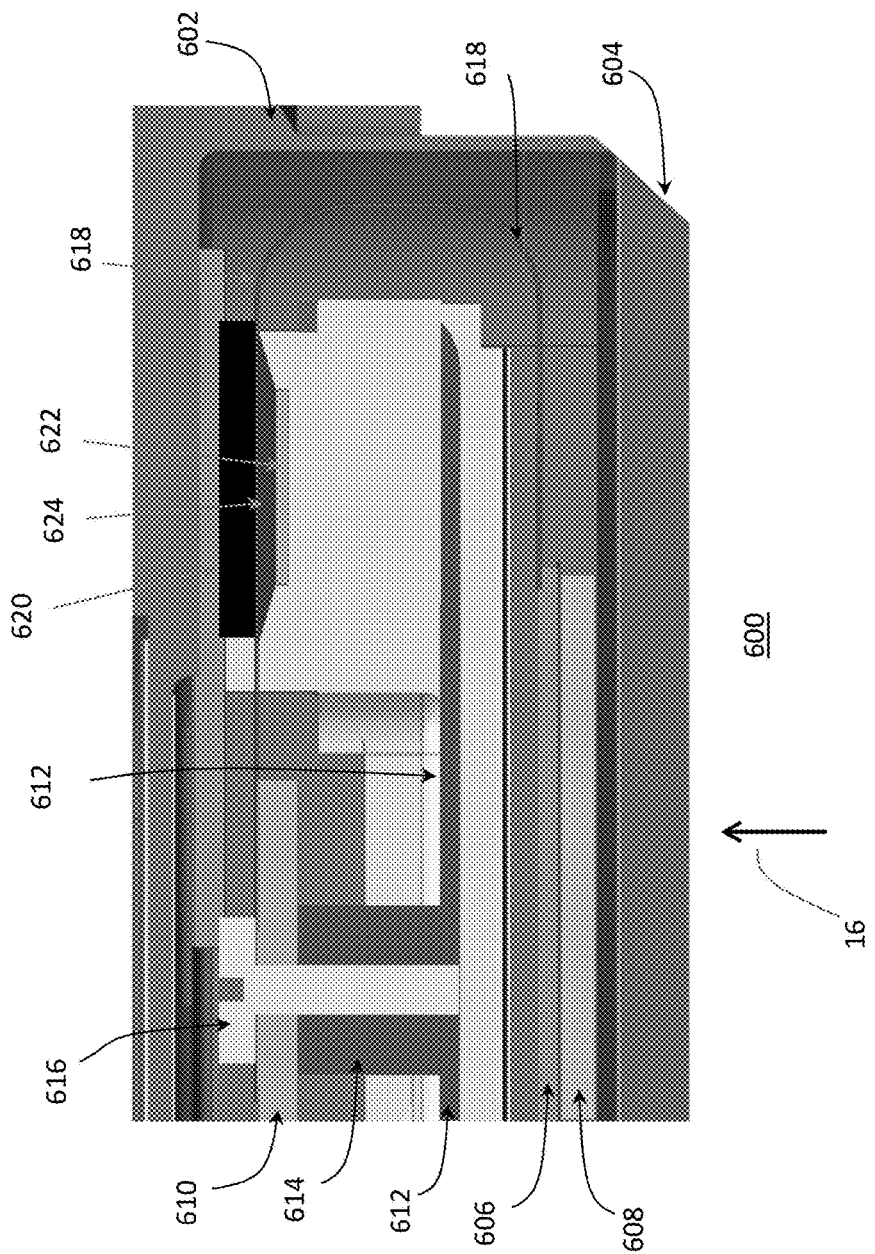
FIG. 6A is a cross section diagram of an exemplary DR detector.

FIG. 6A illustrates in schematic form an exemplary partial cross-section view of an exemplary embodiment of a DR detector 600. The cross-section view of FIG. 6A may resemble, in certain respects, the multi-layer structure of the DR detector depicted in FIG. 4. For spatial reference purposes, the top side of the DR detector 600 is at the bottom of FIG. 6A. The core layers, or sheets, may be disposed within the detector 600 outer assembly, which outer assembly includes the housing 602 and cover panel 604 affixed thereto. The core layers may include an image array 606 including a scintillator layer thereon. A protective foam layer 608 may be positioned between the image array 606 and the cover panel 604 as part of the multi-layer core structure to provide shock absorption. The protective foam layer 608 may be selected to provide an amount of flexible support for both the cover panel 604 and the imaging array 606, and may comprise a foam rubber type of material. The layers just described comprising the core layered structure each may generally be formed in a rectangular shape and defined by edges disposed in parallel with interior sides of the housing 602.

PCB 610 may be electrically connected to a ground plane 612 via a standoff 614 integrally formed with the ground plane 612. A screw 616 may be used to securely connect the PCB 610 to the standoff 614 of the ground plane 612. As described herein, the ground plane 612 may be made from aluminum or another suitable electrically conductive and thermally conductive material.

The imaging array 606 may be electrically connected to readout electronics on the PCB 610 over the CoF flex circuit 618 which may comprise a plurality of flexible, sealed conductors. X-ray flux represented by exemplary x-ray 16 may pass through the radiolucent cover panel 604 to reach the image array 606 as described above. A pliant pressure pad 620 is disposed against an inside bottom surface of the housing 602 and is attached to an IC chip 622 of the CoF flex circuit 618 using a bonding adhesive 624. In the multilayer assembly of FIG. 6A, the thermally conductive ground plane 612 serves a distinct and separate electrical function for the PCB 610, but represents a volume of thermally conductive material that may be reconfigured to also serve as a heat sink to dissipate heat generated by the IC chip 622. Other components of the core layers that are configured to provide distinct functions for the detector may also be reconfigured to also serve as heat sinks for heat generating components inside the detector housing 602. Examples of such other component layers include a shield layer to protect against x-ray scatter, a shield layer to protect against EMI, a substrate layer, a layer to provide structural support for the layered core, or a combination thereof.

Figure 6B:
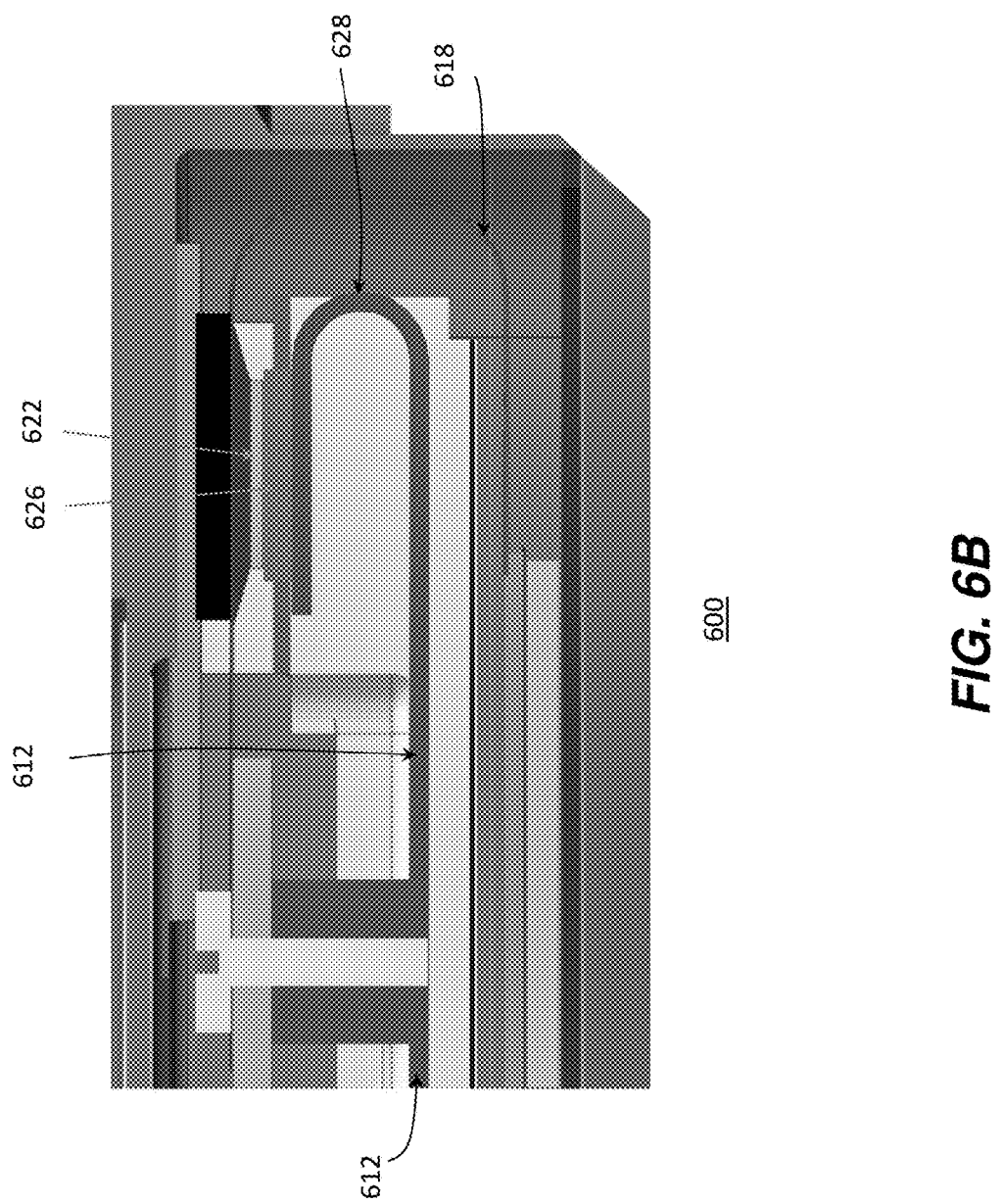
FIGS. 6B-6C are cross section diagrams of an exemplary DR detector with a heat sink.

FIG. 6B illustrates one embodiment of DR detector 600 wherein the ground plane 612 is elongated by the extended portion 628 and extends toward the IC chip 622 of the CoF flex circuit 618. Parts of the DR detector 600 that are described in relation to FIG. 6A are not enumerated in FIG. 6B for clarity. A thermally conductive, flexible heat transfer pad 626 is attached to the IC chip 622 and to the extended portion 628 of the ground plane 612 using, for example, a thermally conductive adhesive. By coupling the ground plane 612 to the IC chip 622 using the heat transfer pad 626, the heat generated by the IC chip 622 may be absorbed by the heat transfer pad 626 and the ground plane 612, which altogether provide an increased volume and surface area for heat dissipation.

Figure 6C:
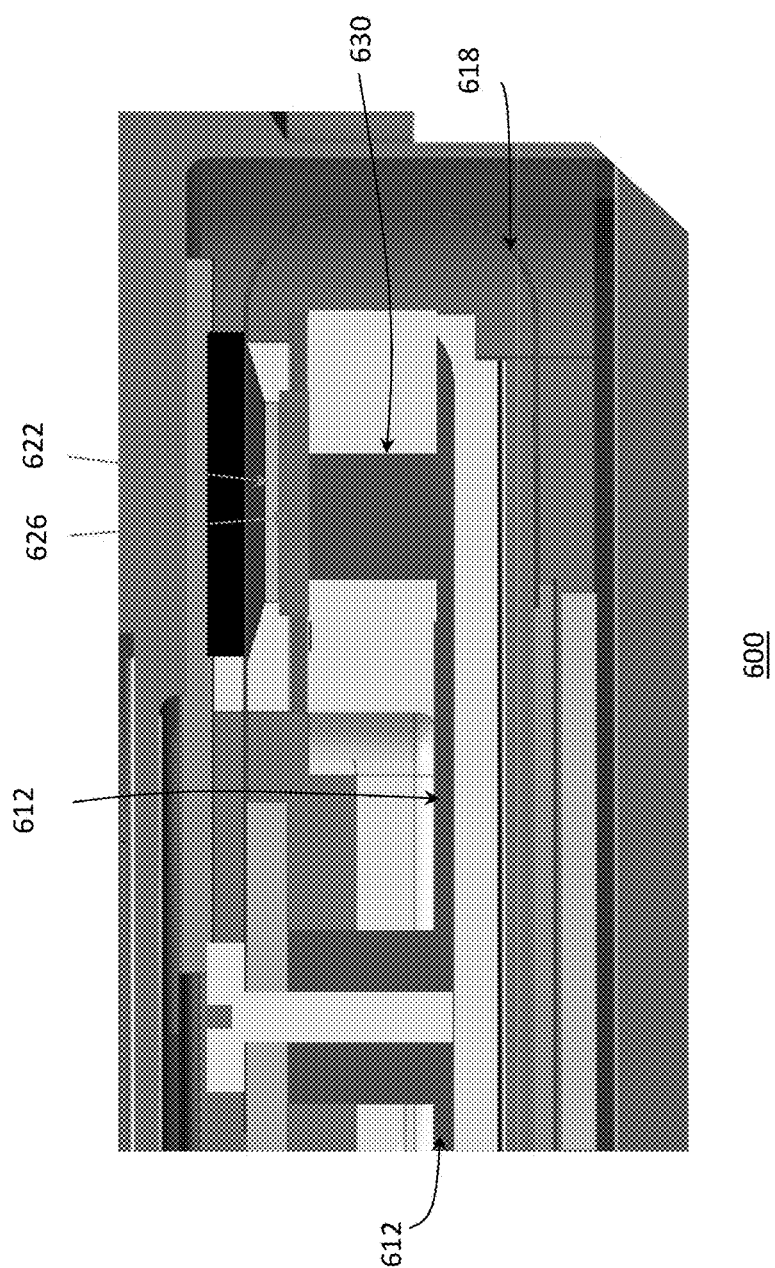

FIG. 6C illustrates one embodiment of DR detector 600 wherein the ground plane 612 is thermally coupled to the IC chip 622 using a thermal link, or thermal circuit, 630, as well as the heat transfer pad 626. The thermal link 630 may be integrally formed as part of the ground plane 612, for example, if the ground plane 612 is formed as a machined aluminum component, the machining process may be configured to form a raised section of the ground plane to serve as the raised thermal link 630. In another embodiment, the thermal link 630 may be separately fabricated and inserted between the ground plane 612 and the heat transfer pad 626. Such a thermal link 630 may be secured in position using a thermally conductive adhesive. As in the embodiment of FIG. 6B, the flexible heat transfer pad 626 is attached to the IC chip 622 and to the thermal link 630 using, for example, a thermally conductive adhesive. In another embodiment, the thermal link 630 may directly physically contact the IC chip 626 without the heat transfer pad 626 therebetween. By coupling the ground plane 612 and the thermal link 630 to the IC chip 622 using the heat transfer pad 626, the heat generated by the IC chip 622 may be absorbed by the heat transfer pad 626, the thermal link 630 and the ground plane 612, which altogether provide an increased volume and surface area for heat dissipation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A digital radiographic detector comprising:
    a multi-layered core comprising:
        a two-dimensional array of photo-sensitive cells,
        an integrated circuit chip in electrical communication with the array of photo-sensitive cells,
        a printed circuit board in electrical communication with the integrated circuit chip, and
        an electrically conductive plate made from a metal, the electrically conductive plate having a standoff integrally formed therewith, the standoff extending from the electrically conductive plate to the printed circuit board and electrically connected to the printed circuit board to provide an electrical ground plane for the printed circuit board, the electrically conductive plate further having a thermal extension integrally formed therewith, the thermal extension extending from the electrically conductive plate to the integrated circuit chip to provide a thermal exit path for heat generated by the integrated circuit chip; and
    a housing to enclose the multi-layered core.

2. The detector of claim 1, wherein the thermal extension of the electrically conductive plate comprises a raised extension formed by machining of the conductive plate.

3. The detector of claim 1, wherein the housing comprises a greater thermal resistance than the electrically conductive plate.

4. The detector of claim 1, further comprising a thermally conductive pad adhered to the integrated circuit chip and abutting the thermal extension of the electrically conductive plate.

5. The detector of claim 4, wherein the electrically conductive plate is configured as a support layer for the two-dimensional array of photo-sensitive cells or a support structure for the multi-layered core.

6. A digital radiographic detector comprising:
    a multi-layered core comprising a two-dimensional array of photo-sensitive cells, circuitry in electrical communication with the array of photosensitive cells, and a grounding member configured to provide a ground plane for the circuitry in electrical communication with the array of photo-sensitive cells;
    a housing to enclose the multi-layered core; and
    a thermally conductive member in thermal communication with both the circuitry in electrical communication with the array of photo-sensitive cells and the grounding member, wherein the grounding member comprises an electrically conductive plate.

7. A digital radiographic detector comprising:
    a multi-layered core comprising:
        a two-dimensional array of photo-sensitive cells,
        an integrated circuit chip in electrical communication with the array of photosensitive cells,
        a printed circuit board in electrical communication with the integrated circuit chip, and
        a shield layer made from a metal configured to provide a shielding function for the detector, the shield layer comprising a thermal extension integrally and continuously formed therewith, the thermal extension continuously extending from the shield layer to the integrated circuit chip to provide a thermal exit path for heat generated by the integrated circuit chip; and
    a housing to enclose the multi-layered core.

8. The detector of claim 7, further comprising a thermally conductive flexible pad configured to abut the integrated circuit chip and the thermal extension to establish a thermally conductive path therebetween.

9. The detector of claim 8, wherein the thermal extension comprises a raised section of the shield layer integrally formed in the shield layer by a machining process.

10. The detector of claim 8, wherein the housing comprises a greater thermal resistance than the thermal extension and the thermally conductive flexible pad.

11. The detector of claim 7, wherein the shield layer is configured as an electromagnetic interference shield or an x-ray shield.

12. The detector of claim 7, wherein the shield layer further comprises a standoff integrally formed therewith, the standoff extending from the shield layer to the printed circuit board and electrically connected to the printed circuit board to provide an electrical ground plane for the printed circuit board.

* * * * *